United States Patent
Shin et al.

(10) Patent No.: US 9,263,125 B2
(45) Date of Patent: Feb. 16, 2016

(54) NONVOLATILE MEMORY APPARATUS, AND SEMICONDUCTOR SYSTEM AND COMPUTER DEVICE USING THE SAME

(71) Applicant: SK hynix Inc., Icheon-si Gyeonggi-do (KR)

(72) Inventors: Min Chul Shin, Icheon-si Gyeonggi-do (KR); Yoon Jae Shin, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 202 days.

(21) Appl. No.: 14/091,992

(22) Filed: Nov. 27, 2013

(65) Prior Publication Data

US 2015/0049561 A1  Feb. 19, 2015

(30) Foreign Application Priority Data

Aug. 19, 2013 (KR) .......................... 10-2013-0097819

(51) Int. Cl.
*G11C 7/06* (2006.01)
*G11C 13/00* (2006.01)
*G11C 5/14* (2006.01)
*G11C 7/08* (2006.01)
*G11C 11/56* (2006.01)

(52) U.S. Cl.
CPC ............... *G11C 13/004* (2013.01); *G11C 5/143* (2013.01); *G11C 5/147* (2013.01); *G11C 7/06* (2013.01); *G11C 7/08* (2013.01); *G11C 11/56* (2013.01); *G11C 2211/563* (2013.01)

(58) Field of Classification Search
CPC ............ G11C 7/06; G11C 7/08; G11C 5/143; G11C 5/147
USPC ..................... 365/206, 189.15, 226
See application file for complete search history.

(56) References Cited

U.S. PATENT DOCUMENTS

| 7,782,679 | B2 | 8/2010 | Yun | |
| 2005/0237798 | A1* | 10/2005 | Urabe et al. | 365/185.03 |
| 2010/0188920 | A1* | 7/2010 | Futatsuyama et al. | 365/226 |
| 2013/0135944 | A1* | 5/2013 | Braceras et al. | 365/189.07 |

FOREIGN PATENT DOCUMENTS

KR        1019950004642 B1      5/1995

* cited by examiner

*Primary Examiner* — Huan Hoang
*Assistant Examiner* — Jay Radke
(74) *Attorney, Agent, or Firm* — William Park & Associates Ltd.

(57) ABSTRACT

A nonvolatile memory apparatus includes a memory cell array including a plurality of sub arrays. A plurality of analog-to-digital converters (ADCs) configured to sense sensing voltages outputted from memory cells of the plurality of sub arrays and a path selection unit configured to electrically couple the plurality of sub arrays with the plurality of ADCs in one-to-one correspondence in a first operation mode, and electrically couple the plurality of ADCs with a terminal of a power supply voltage in a second operation mode.

25 Claims, 10 Drawing Sheets

NONVOLATILE MEMORY APPARATUS, AND SEMICONDUCTOR SYSTEM AND COMPUTER DEVICE USING THE SAME

CROSS-REFERENCES TO RELATED APPLICATION

The present application claims priority under 35 U.S.C. §119(a) to Korean application number 10-2013-0097819, filed on Aug. 19, 2013, in the Korean Intellectual Property Office, which is incorporated herein by reference in its entirety.

BACKGROUND

1. Technical Field

Various embodiments relate to a semiconductor apparatus, and more particularly, to a memory apparatus including nonvolatile memory cells and a semiconductor system using the same.

2. Related Art

In general, a DRAM includes a memory cell constituted by a capacitor, and data is stored by charging or discharging the capacitor of the memory cell. However, since the capacitor has a leakage due to the characteristics thereof, the DRAM has a disadvantage in that it is a volatile memory. In order to overcome the disadvantage, memories which are nonvolatile and do not need the refreshing of data have been developed. In particular, attempts have continuously been made to realize nonvolatility by modifying the structure of a memory cell. One of these attempts is a resistive memory apparatus which includes a resistive memory cell.

A resistive memory apparatus includes a memory cell which is formed of a variable resistance substance, and the variable resistance substance may have a resistance value that is changed according to the magnitude of current flowing through it. Accordingly, by controlling the magnitude of current to be applied to the memory cell, desired data may be written in the memory cell. For instance, in the case where the memory cell is a high resistance state, the memory cell may have stored data of 0, and, in the case where the memory cell is a low resistance state, the memory cell may have stored data of 1. The variable resistance substance may have at least three resistance states. Therefore, the memory cell of the resistive memory apparatus may be utilized as a multi-level cell capable of storing multi-bit data.

FIG. 1 is a diagram schematically showing the configuration of a conventional resistive memory apparatus 10. In FIG. 1, the resistive memory apparatus 10 includes a memory cell array 11, a row decoding unit 12, a column decoding unit 13, and a read driver 14. In the memory cell array 11, a plurality of word lines including WL0 to WL2 and a plurality of bit lines including BL0 to BL2 are disposed, and memory cells MC are electrically coupled to the crossing points of the word lines and the bit lines. The row decoding unit 12 selects a word line to access, in response to a row address, and the column decoding unit 13 selects a bit line to access, in response a column address. Accordingly, as a specified word line and a specified bit line are selected, a specified memory cell MC may be accessed.

The read driver 14 applies sensing current and/or a voltage to the accessed memory cell MC in a read operation. By sensing a voltage and/or current which changes according to the resistance value of the memory cell MC, it is possible to read the data stored in the memory cell MC. In the case where the memory cell MC is a multi-level cell, in order to precisely read the multi-bit data stored in the memory cell MC, the read driver 14 may include an analog-to-digital converter (ADC).

SUMMARY

A nonvolatile memory apparatus that can utilize analog-to-digital converters, which normally are used to read multi-level data, for various other uses and a semiconductor system using the same are described herein.

In an embodiment of the present invention, a nonvolatile memory apparatus includes: a memory cell array including a plurality of sub arrays; a plurality of ADCs configured to sense sensing voltages outputted from memory cells of the plurality of sub arrays; and a path selection unit configured to electrically couple the plurality of sub arrays with the plurality of ADCs in one-to-one correspondence in a first operation mode, and electrically couple the plurality of ADCs with a terminal of a power supply voltage in a second operation mode.

In an embodiment of the present invention, a nonvolatile memory apparatus includes: a first ADC array configured to sense sensing voltages outputted from memory cells of a first memory bank; a second ADC array configured to sense sensing voltages outputted from memory cells of a second memory bank; a first path selection unit configured to electrically couple the first ADC array with a terminal of a power supply voltage when a normal operation is not performed for the first memory bank; and a second path selection unit configured to electrically couple the second ADC array with the terminal of the power supply voltage when a normal operation is not performed for the second memory bank.

In an embodiment of the present invention, a semiconductor system includes: a processor; and a nonvolatile memory configured to operate by receiving a power supply voltage and a plurality of commands from the processor, wherein the nonvolatile memory includes an ADC array configured to read data stored in a memory cell array; and a path selection unit configured to electrically couple the ADC array with a terminal of the power supply voltage in response to one of the plurality of commands.

In an embodiment of the present invention, a semiconductor system includes: a processor; and a nonvolatile memory configured to operate by receiving a power supply voltage, wherein the nonvolatile memory includes an ADC array configured to read data stored in a memory cell array in a first operation mode; a path selection unit configured to electrically couple the ADC array with a terminal of the power supply voltage in a second operation mode; and a decoupling capacitor array configured to control a level of the power supply voltage in response to an output of the ADC array in the second operation mode.

In an embodiment of the present invention, a semiconductor system includes: a processor configured to generate a clock and provide the clock to a nonvolatile memory; and the nonvolatile memory configured to operate by receiving a power supply voltage and the clock, wherein the nonvolatile memory includes an ADC array configured to read data stored in a memory cell array in a first operation mode; and a path selection unit configured to electrically couple the ADC array with a terminal of the power supply voltage in a second operation mode, and wherein the processor changes a frequency of the clock on the basis of an output of the ADC array in the second operation mode.

In an embodiment of the present invention, a computer device includes: a processor; a nonvolatile memory configured to communicate with the processor; and a power management circuit configured to provide a first power supply voltage to the processor and provide a second power supply voltage to the nonvolatile memory, wherein the nonvolatile memory includes: an ADC array configured to read data stored in a memory cell array in response to a first command; and a path selection unit configured to electrically couple the ADC array with a terminal of the first power supply voltage in response to a second command, and electrically couple the ADC array with a terminal of the second power supply voltage in response to a third command.

In an embodiment of the present invention, a nonvolatile memory apparatus includes: a memory cell array including a plurality of sub arrays; a plurality of ADCs configured to sense sensing voltages outputted from memory cells of the plurality of sub arrays; and a path selection unit configured to electrically couple the plurality of sub arrays with the plurality of ADCs in a first operation mode, and electrically couple the plurality of ADCs with a terminal of a power supply voltage in a second operation mode.

BRIEF DESCRIPTION OF THE DRAWINGS

Features, aspects, and embodiments are described in conjunction with the attached drawings, in which.

DETAILED DESCRIPTION

Hereinafter, a nonvolatile memory apparatus and a semiconductor system using the same according to the present invention will be described below with reference to the accompanying drawings through various embodiments.

Figure 1:
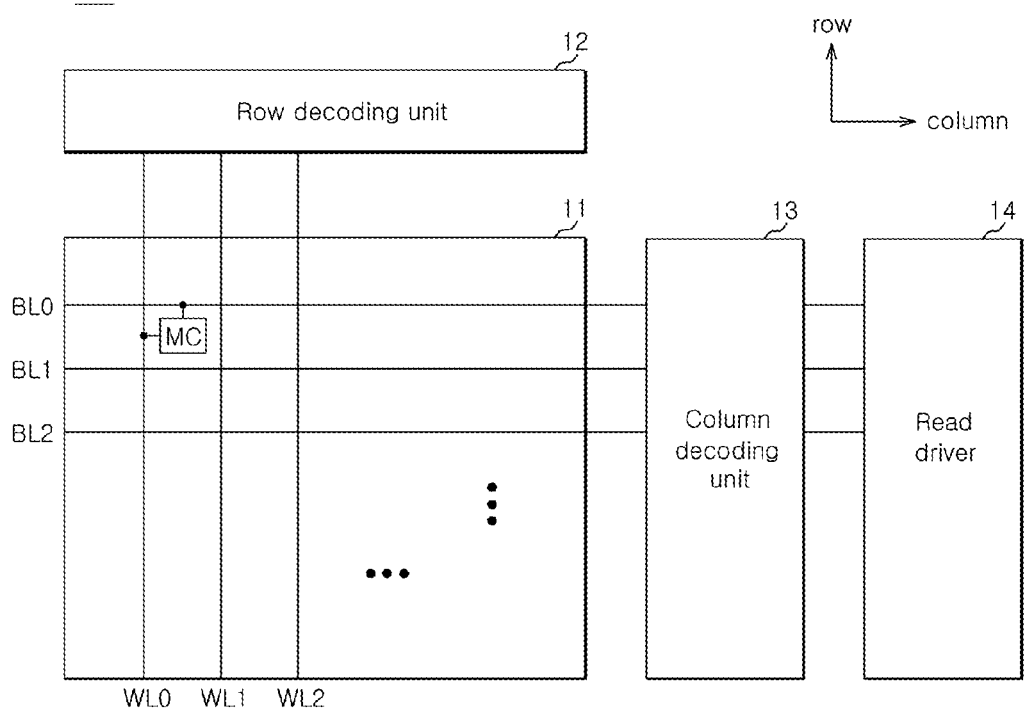
FIG. 1 is a block diagram schematically showing the configuration of a conventional resistive memory apparatus.
Figure 2:
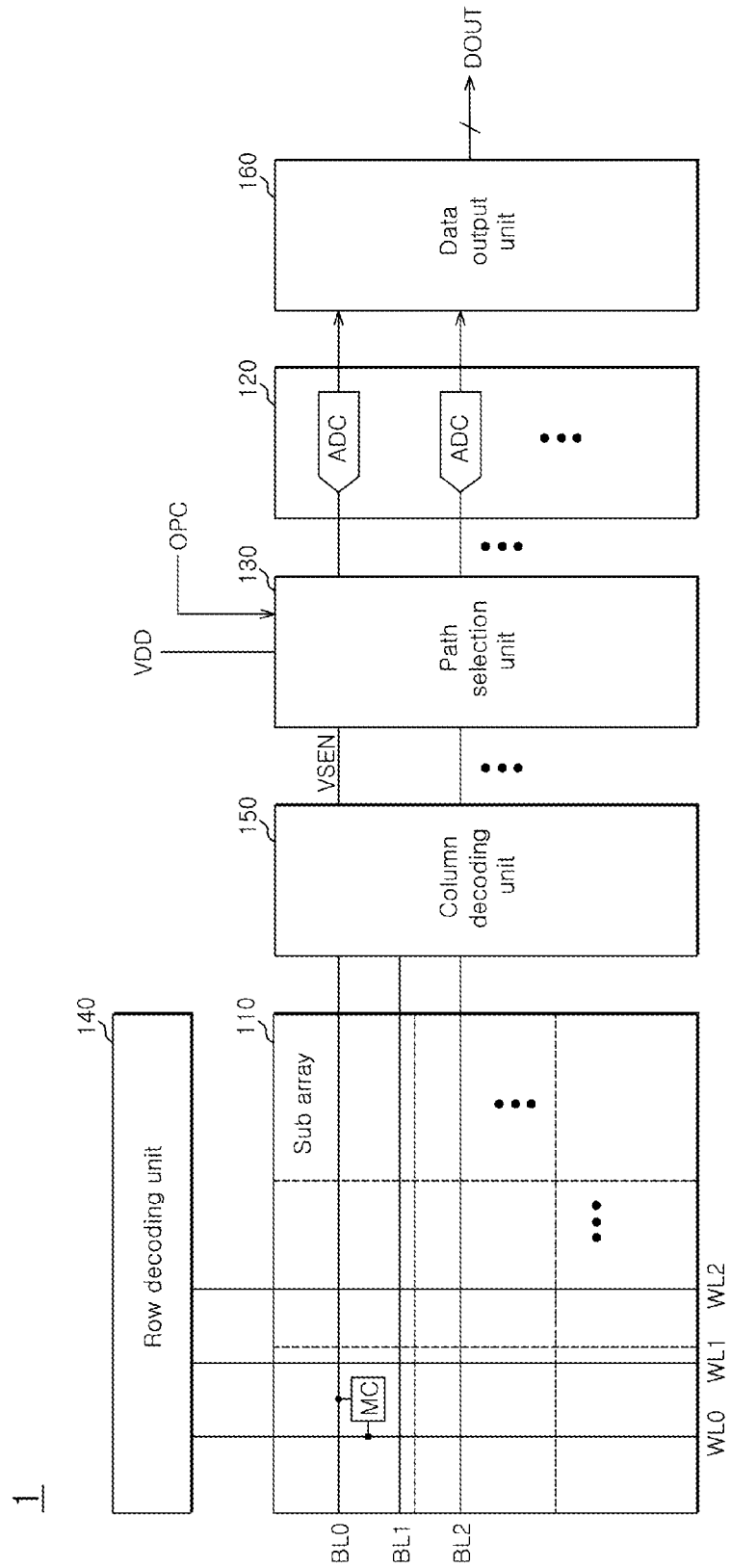
FIG. 2 is a block diagram showing the configuration of a nonvolatile memory apparatus in accordance with an embodiment of the present disclosure.

In FIG. 2, a nonvolatile memory apparatus 1 may include a memory cell array 110, an ADC array 120, and a path selection unit 130. In the present specification, an ADC may be used as a term that stands for an analog-to-digital converter. In the memory cell array 110, a plurality of word lines WL0 to WL2 are disposed in the row direction, and a plurality of bit lines BL0 to BL2 are disposed in the column direction. Memory cells MC are electrically coupled to the crossing points of the word lines WL0 to WL2 and the bit lines BL0 to BL2. The memory cells MC are formed of a resistive substance and may store desired data according to changes of resistance. The memory cells MC may store 1-bit data with the logic levels of 0 and 1, or may store multi-level data of 2 bits or more.

The memory cell array 110 may be divided into plurality of sub arrays. A row decoding unit 140 and a column decoding unit 150 are disposed on sides of the memory cell array 110. The row decoding unit 140 may select a word line to access, in response to a row address signal. The column decoding unit 150 may select a bit line to access, in response to a column address signal. If a specified word line and a specified bit line are selected by the row decoding unit 140 and the column decoding unit 150, a specified memory cell may be accessed.

The ADC array 120 includes a plurality of ADCs. The ADC array 120 may read the data stored in the memory cells MC of the memory cell array 110. That is to say, the ADC array 120 may sense the sensing voltages outputted from the memory cells MC of the memory cell array 110. For example, the plurality of ADCs may be provided by the same number as the number of the sub arrays which constitute the memory cell array 110, while not being limited to such. The plurality of ADCs may be respectively electrically coupled with the sub arrays and may receive the sensing voltages which are outputted from the memory cells MC of the memory cell array 110. The plurality of ADCs may be electrically coupled with the respective sub arrays in one-to-one correspondence.

The path selection unit 130 may be configured to electrically couple the plurality of ADCs of the ADC array 120 with the respective sub arrays in one-to-one correspondence in a first operation mode, and electrically couple the plurality of ADCs with the terminal of a power supply voltage VDD in a second operation mode. In an embodiment of the present disclosure, the first operation mode may be a normal operation mode, and the second operation mode may be any other operation modes other than the normal operation mode. The normal operation mode may mean, for example, a read operation as an operation for the nonvolatile memory apparatus 1 to output data. The second operation mode may mean all operation modes other than the read operation that may be performed by the nonvolatile memory apparatus 1.

The first and second operation modes may be distinguished by an operation mode setting signal OPC. The operation mode setting signal OPC may be generated by an internal control circuit of the nonvolatile memory apparatus 1 or may be received from an external device. The path selection unit 130 may electrically couple the ADC array 120 with one of the memory cell array 110 and the terminal of the power supply voltage VDD in response to the operation mode setting signal OPC. For instance, the path selection unit 130 may electrically couple the ADC array 120 with the memory cell array 110 in the state in which the operation mode setting signal OPC is disabled, and may electrically couple the ADC array 120 with the terminal of the power supply voltage VDD in the state in which the operation mode setting signal OPC is enabled. In particular, the path selection unit 130 may electrically couple in parallel the plurality of ADCs constituting the ADC array 120 with the terminal of the power supply voltage VDD.

The path selection unit 130 may increase utilization of the ADC array 120. Since it is sufficient for the plurality of ADCs constituting the ADC array 120 to be able to read the values of the data stored in the memory cells MC, it is not necessary to use ADCs with high performance. However, it is actually impossible to detect the noise of power by using ADCs with performance of a level capable of discriminating the values of data. In consideration of these facts, the path selection unit 130 electrically couples in parallel the plurality of ADCs with the terminal of the power supply voltage VDD, thereby allowing the plurality of ADCs to integrally operate as a high performance ADC.

In FIG. 2, the nonvolatile memory apparatus 1 may further include a data output unit 160. The data output unit 160 may be configured to be electrically coupled with the ADC array 120 and receive the signals outputted from the plurality of ADCs. The data output unit 160 may combine the output signals of the plurality of ADCs and generate output data DOUT. The generated output data DOUT may be outputted to an external device through a data bus.

Figure 3:
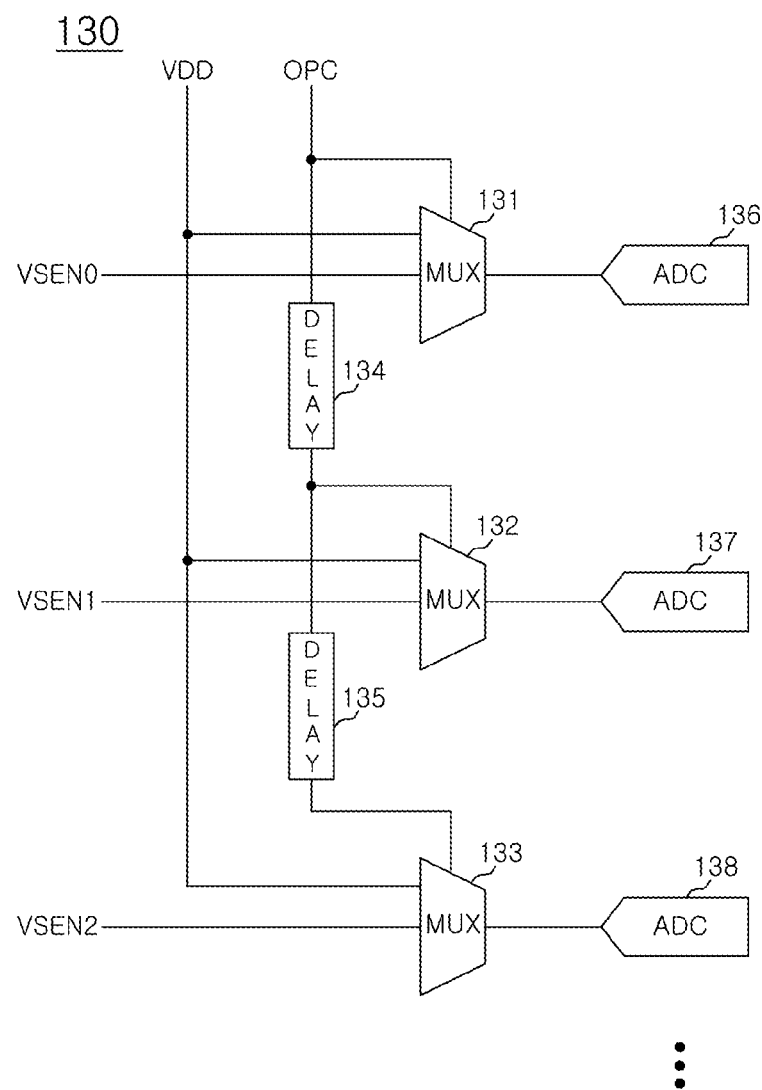
FIG. 3 is a diagram showing the configuration of an example of an embodiment of the path selection unit shown in FIG. 2.

FIG. 3 is a diagram showing the configuration of an example of an embodiment of the path selection unit 130 shown in FIG. 2. In FIG. 3, the path selection unit 130 may include a plurality of multiplexers MUX and a plurality of delay sections DELAY. While 3 multiplexers MUX and 2 delay sections DELAY are representatively shown in FIG. 3, it is to be noted that the numbers of the multiplexers MUX and the delay sections DELAY may be increased or decreased according to the number of the ADCs or the sub arrays. A first multiplexer 131 electrically couples one of a first sensing voltage VSEN0 outputted from a first sub array of the memory cell array 110 and the power supply voltage VDD, with the input terminal of a first ADC 136 in response to the operation mode setting signal OPC. A first delay section 134 delays the operation mode setting signal OPC by a predetermined time, and provides the delayed operation mode setting signal OPC to a second multiplexer 132.

The second multiplexer 132 receives a second sensing voltage VSEN1 outputted from a second sub array of the memory cell array 110 and the power supply voltage VDD. The second multiplexer 132 electrically couples one of the second sensing voltage VSEN1 and the power supply voltage VDD with the input terminal of a second ADC 137 in response to the operation mode setting signal OPC which is delayed by the first delay section 134. A second delay section 135 delays the operation mode setting signal OPC delayed by the first delay section 134, by the predetermined time, and provides the delayed operation mode setting signal OPC to a third multiplexer 133. The third multiplexer 133 electrically couples one of a third sensing voltage VSEN2 outputted from a third sub array of the memory cell array 110 and the power supply voltage VDD, with the input terminal of a third ADC 138 in response to the operation mode setting signal OPC which is delayed by the second delay section 135.

The first and second delay sections 134 and 135 may have the same delay amount, and the delay amount may be randomly determined. The first and second delay sections 134 and 135 may determine the sampling timings of the first to third ADCs 136, 137 and 138. When assuming that the delay time of each of the first and second delay sections 134 and 135 is t, the first multiplexer 131 may provide the power supply voltage VDD to the first ADC 136 at the time of A, the second multiplexer 132 may provide the power supply voltage VDD to the second ADC 137 at the time of A+t, and the third multiplexer 133 may provide the power supply voltage VDD to the third ADC 138 at the time of A+2*t. Accordingly, the first ADC 136 may convert the level of the power supply voltage VDD into digital codes at the time of A, the second ADC 137 may convert the level of the power supply voltage VDD into digital codes at the time of A+t, and the third ADC 138 may convert the level of the power supply voltage VDD into digital codes at the time of A+2*t. Accordingly, the first to third ADCs 136, 137 and 138 may sample the level of the power supply voltage VDD with the time interval of t and convert the level of the power supply voltage VDD into digital codes. Accordingly, the first to third ADCs 136, 137 and 138 may operate as a high performance ADC capable of sampling the power supply voltage VDD with a short time interval.

Figure 4:
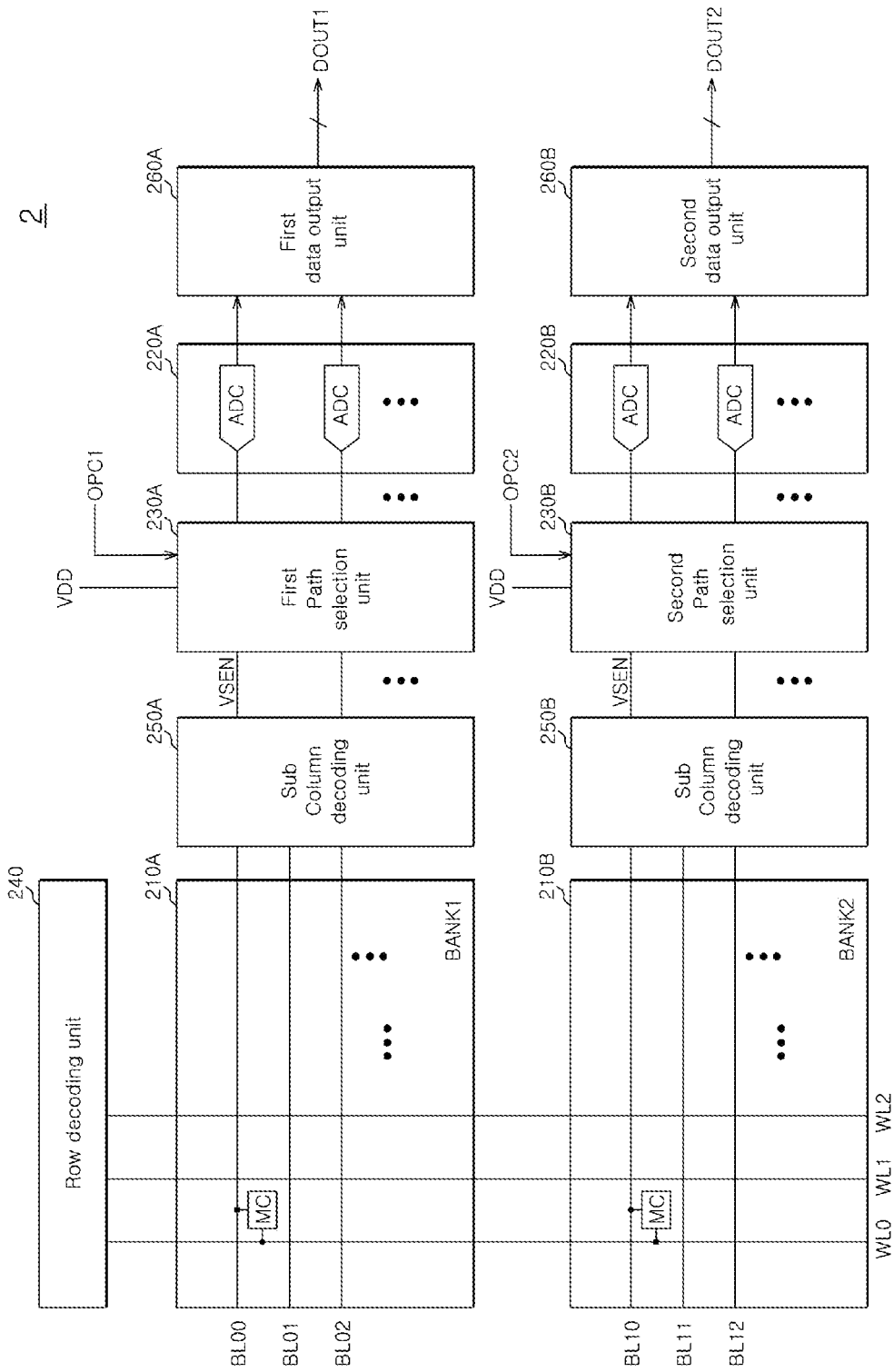
FIG. 4 is a block diagram showing the configuration of a nonvolatile memory apparatus in accordance with other embodiments of the present disclosure.

FIG. 4 is a block diagram showing the configuration of a nonvolatile memory apparatus 2 in accordance with an embodiment of the present disclosure. In FIG. 4, the nonvolatile memory apparatus 2 may include a first memory bank 210A, a second memory bank 210B, a first ADC array 220A, a second ADC array 220B, a first path selection unit 230A, and a second path selection unit 230B. The first and second memory banks 210A and 210B may constitute the memory cell array of the nonvolatile memory apparatus 2. In the first and second memory banks 210A and 210B, a plurality of word lines WL0 to WL2 and a plurality of bit lines BL00 to BL02 and BL10 to BL12 are disposed, and memory cells MC may be electrically coupled with points where the word lines WL0 to WL2 and the bit lines BL00 to BL02 and BL10 to BL12 cross each other.

A row decoding unit 240 and sub column decoding units 250A and 250B may be disposed on sides of the first and second memory banks 210A and 210B. The row decoding unit 240 may select a specified word line in response to a row address signal. The sub column decoding units 250A and 250B may respectively select specified bit lines disposed in the first and second memory banks 210A and 210B in response to column address signals. Hence, if a specified word line and specified bit lines are selected, specified memory cells may be accessed.

The first ADC array 220A may read the data stored in the memory cells of the first memory bank 210A (i.e., BANK1). The first ADC array 220A may receive the sensing voltages (i.e., VSEN) which are outputted from the memory cells of the first memory bank 210A. The first ADC array 220A may include a plurality of ADCs, and the plurality of ADCs may be electrically coupled with sub arrays constituting the first memory bank 210A in one-to-one correspondence. The second ADC array 220B may read the data stored in the memory cells of the second memory bank 210B. The second ADC array 220B may receive the sensing voltages (i.e., VSEN) which are outputted from the memory cells of the second memory bank 210B (i.e., BANK1). The second ADC array 220B may include a plurality of ADCs, and the plurality of ADCs may be electrically coupled with sub arrays constituting the second memory bank 210B in one-to-one correspondence.

The first path selection unit 230A electrically couples the first ADC array 220A with the terminal of a power supply voltage VDD when a normal operation for the first memory bank 210A is not performed. The second path selection unit 230B electrically couples the second ADC array 220B with the terminal of the power supply voltage VDD when a normal operation for the second memory bank 210B is not performed. For instance, when the normal operation for the first memory bank 210A is performed and the normal operation for the second memory bank 210B is not performed, the second path selection unit 230B electrically couples the second ADC array 220B with the terminal of the power supply voltage VDD such that the noise of the power supply voltage VDD may be monitored. The nonvolatile memory apparatus 2 is configured such that, even though a normal operation for a certain bank is performed, the noise of a power supply voltage may always be monitored through a path selection unit and an ADC array which are electrically coupled with a memory bank for which a normal operation is not performed.

The first path selection unit 230A may electrically couple the first ADC array 220A with the memory cells of the first memory bank 210A or the terminal of the power supply voltage VDD in response to a first operation mode setting signal OPC1, and the second path selection unit 230B may electrically couple the second ADC array 220B with the memory cells of the second memory bank 210B or the terminal of the power supply voltage VDD in response to a second operation mode setting signal OPC2. Each of the first and second operation mode setting signals OPC1 and OPC2 may include information on selection of a bank and information on a normal operation. The first operation mode setting signal OPC1 includes bank selecting information for the first memory bank 210A and information on the normal operation, and the second operation mode setting signal OPC2 includes bank selecting information for the second memory bank 210B and information on the normal operation. Accordingly, the first and second operation mode setting signals OPC1 and OPC2 may include information on whether or not the first and second memory banks 210A and 210B respectively perform the normal operations.

In FIG. 4, the nonvolatile memory apparatus 2 may further include a first data output unit 260A and a second data output unit 260B. The first data output unit 260A is electrically coupled with the first ADC array 220A, and is configured to receive the signals outputted from the plurality of ADCs of the first ADC array 220A. The first data output unit 260A may combine the output signals of the plurality of ADCs and generate first output data DOUT1. The generated first output data DOUT1 may be outputted to an external device through a data bus. The second data output unit 260B is electrically coupled with the second ADC array 220B, and is configured to receive the signals outputted from the plurality of ADCs of the second ADC array 220B. The second data output unit 260B may combine the output signals of the plurality of ADCs and generate second output data DOUT2. The generated second output data DOUT2 may be outputted to an external device through a data bus.

Figure 5:
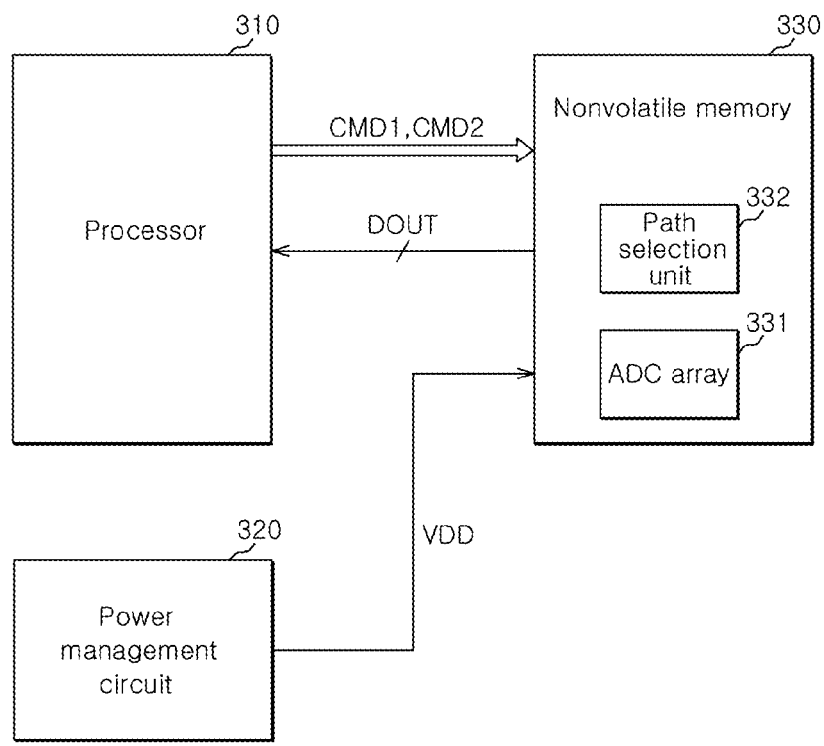
FIG. 5 is a block diagram schematically showing the configuration of a semiconductor system in accordance with other embodiments of the present disclosure.

FIG. 5 is a block diagram schematically showing the configuration of a semiconductor system 3 in accordance with an embodiment of the present disclosure. In FIG. 5, the semiconductor system 3 may include a processor 310, a power management circuit 320, and a nonvolatile memory 330. The processor 310 may be configured to control operations of the nonvolatile memory 330 and communicate with the nonvolatile memory 330. The processor 310 may provide a plurality of commands to the nonvolatile memory 330. The plurality of commands may include first and second commands CMD1 and CMD2. The first command CMD1 may command the nonvolatile memory 330 to operate under a first operation mode, and the second command CMD2 may command the nonvolatile memory 330 to operate under a second operation mode. Also, while not shown, the processor 310 may provide data and a clock to the nonvolatile memory 330. While the processor 310 is exemplified in FIG. 5, the processor 310 may be replaced with a nonvolatile memory controller in an embodiment.

The power management circuit 320 may provide a power supply voltage VDD to the nonvolatile memory 330. The power management circuit 320 may receive a boot-up signal from the processor 310 and provide the power supply voltage VDD to the nonvolatile memory 330. For example, if the power button of a computer device is turned on, the processor 310 may generate a boot-up signal, and the power management circuit 320 may provide the power supply voltage VDD in response to the boot-up signal to allow the nonvolatile memory 330 to operate. The power management circuit 320 may include a power unit and a power control unit, and may provide power suitable for allowing not only the nonvolatile memory 330 but also the processor 310 to operate.

The nonvolatile memory 330 may communicate with the processor 310, and may operate by receiving the plurality of commands from the processor 310. Further, the nonvolatile memory 330 may output data to the processor 310 through a data bus. The nonvolatile memory 330 may have the same configuration as the nonvolatile memory apparatus 1 or 2 shown in FIG. 2 or 4.

The nonvolatile memory 330 may include an ADC array 331 and a path selection unit 332. The ADC array 331 may read the data stored in the memory cells of the nonvolatile memory 330. The path selection unit 332 electrically couples the ADC array 331 with the terminal of the power supply voltage VDD in response to at least one of the plurality of commands. The nonvolatile memory 330 may receive the first command CMD1 and perform a normal operation in the first operation mode, and may receive the second command CMD2 and monitor noise of the power supply voltage VDD in the second operation mode. Accordingly, if the first command CMD1 is provided from the processor 310, the ADC array 331 may read the data stored in the memory cells, and if the second command CMD2 is provided from the processor 310, the path selection unit 332 may electrically couple the ADC array 331 with the terminal of the power supply voltage VDD such that the ADC array 331 may monitor the noise of the power supply voltage VDD. The ADC array 331 may output the result of monitoring the noise of the power supply voltage VDD, to the processor 310 through the data bus (for example, output data DOUT through the output data line or data bus as illustrated), in the same manner as data are outputted in the normal operation.

Figure 6:
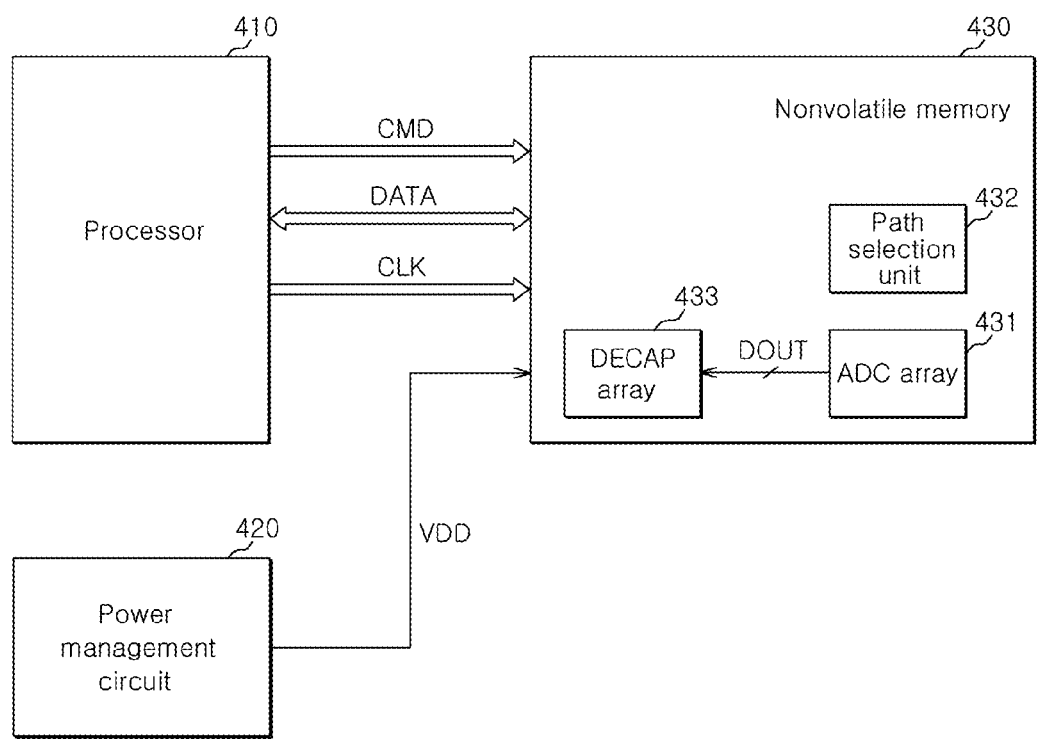
FIG. 6 is a block diagram schematically showing the configuration of a semiconductor system in accordance with other embodiments of the present disclosure.

FIG. 6 is a block diagram schematically showing the configuration of a semiconductor system 4 in accordance with an embodiment of the present disclosure. In FIG. 6, the semiconductor system 4 may include a processor 410, a power management circuit 420, and a nonvolatile memory 430. The processor 410 may be configured to communicate with the nonvolatile memory 430, and provide a command CMD, data DATA and a clock CLK to the nonvolatile memory 430. The power management circuit 420 may be configured to provide a power supply voltage VDD to the nonvolatile memory 430 when a boot-up signal is received from the processor 410.

The nonvolatile memory 430 may include a decoupling capacitor array 433 (i.e., DECAP array) in addition to an ADC array 431 and a path selection unit 432. The decoupling capacitor array 433 includes a plurality of decoupling capacitors and receives the power supply voltage VDD provided from the power management circuit 420. The decoupling capacitor array 433 receives the power supply voltage VDD and provides the power supply voltage VDD to the internal circuits of the nonvolatile memory 430. The decoupling capacitor array 433 is provided to reduce noise that is likely to be generated in the power supply voltage VDD. Without a limiting sense, the decoupling capacitor array 433 may have a structure in which a plurality of decoupling capacitors are electrically coupled through switches to the reception terminal of the power supply voltage VDD.

The ADC array 431 may be configured to read the data stored in the memory cells of the nonvolatile memory 430 in a first operation mode. The data read from the memory cells may be outputted to the processor 410. The path selection unit 432 may be configured to electrically couple the ADC array 431 with the terminal of the power supply voltage VDD in a second operation mode. The ADC array 431 may be electrically coupled with the terminal of the power supply voltage VDD in the second operation mode and may monitor the noise of the power supply voltage VDD. A monitoring result signal DOUT may be provided to the decoupling capacitor array 433.

The decoupling capacitor array 433 may receive the result signal DOUT of monitoring the noise of the power supply voltage VDD, from the ADC array 431 in the second operation mode, and may control the number of decoupling capacitors which are electrically coupled with the reception terminal of the power supply voltage VDD. In other words, the result signal DOUT of monitoring the noise of the power supply voltage VDD may be used as a signal for controlling the switches of the decoupling capacitor array 433. The decoupling capacitor array 433 may reduce the noise of the power supply voltage VDD by controlling the number of decoupling capacitors electrically coupled with the reception terminal of the power supply voltage VDD according to the monitoring result signal DOUT.

Figure 7:
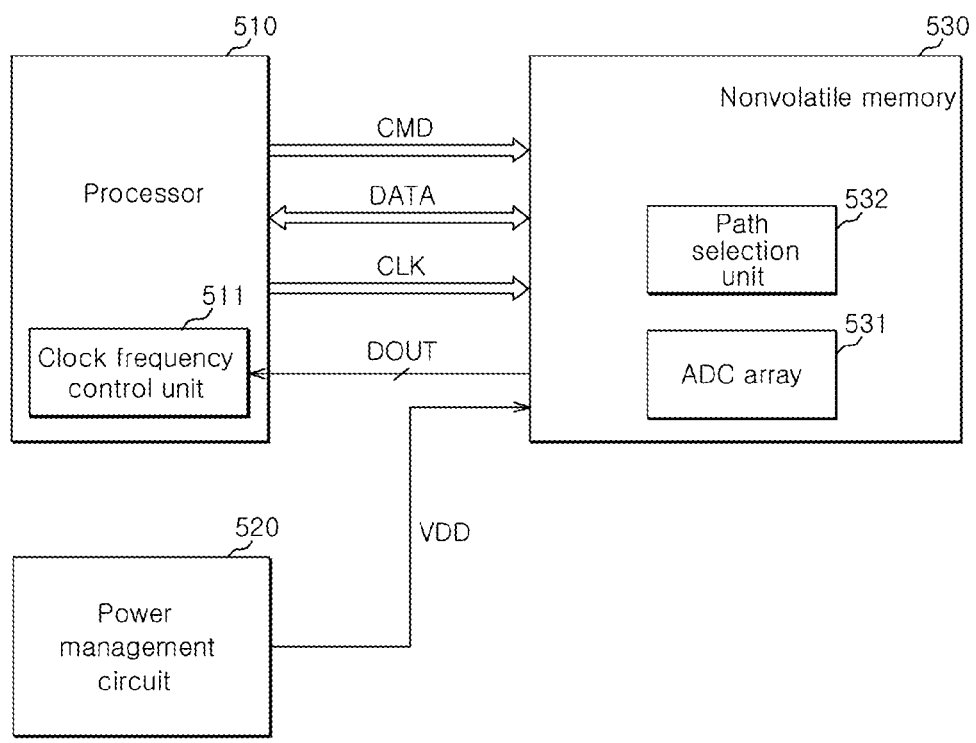
FIG. 7 is a block diagram schematically showing the configuration of a semiconductor system in accordance with other embodiments of the present disclosure.

FIG. 7 is a block diagram schematically showing the configuration of a semiconductor system 5 in accordance with an embodiment of the present disclosure. In FIG. 7, the semiconductor system 5 may include a processor 510, a power management circuit 520, and a nonvolatile memory 530. The processor 510 may be configured to communicate with the nonvolatile memory 530 and provide a command CMD, data DATA and a clock CLK to the nonvolatile memory 530. The power management circuit 520 may be configured to receive a boot-up signal from the processor 510, and provide a power supply voltage VDD to the nonvolatile memory 530.

The nonvolatile memory 530 may include an ADC array 531, and a path selection unit 532. The ADC array 531 may be configured to read the data stored in the memory cells of the nonvolatile memory 530 in a first operation mode. The data read by the ADC array 531 may be outputted to the processor 510. The path selection unit 532 may be configured to electrically couple the ADC array 531 with the terminal of the power supply voltage VDD in a second operation mode. Accordingly, the ADC array 531 may output a result signal DOUT of monitoring the noise of the power supply voltage VDD in the second operation mode. While it is shown in FIG. 7 that the monitoring result signal DOUT is provided to the processor 510 through a separate bus, it may be provided to the processor 510 through a data bus through which the data DATA are transmitted.

The processor 510 may receive the monitoring result signal DOUT from the nonvolatile memory 530 in the second operation mode. The processor 510 may change the frequency of the clock CLK which is to be provided to the nonvolatile memory 530, according to the monitoring result signal DOUT. The processor 510 may include a clock frequency control unit 511. The clock frequency control unit 511 may be realized by a circuit such as a phase locked loop (PLL), and may be provided inside or outside the processor 510. The clock frequency control unit 511 may receive the monitoring result signal DOUT and control the frequency of the clock CLK, which is to be provided to the nonvolatile memory 530, in response to DOUT. Since most of the noise of the power supply voltage VDD may be generated in a resonating condition, the clock frequency control unit 511 may reduce the noise of the power supply voltage VDD through increasing or decreasing the frequency of the clock CLK by a predetermined hertz, when it is determined according to the monitoring result signal DOUT that substantial noise is generated in the power supply voltage VDD.

Figure 8:
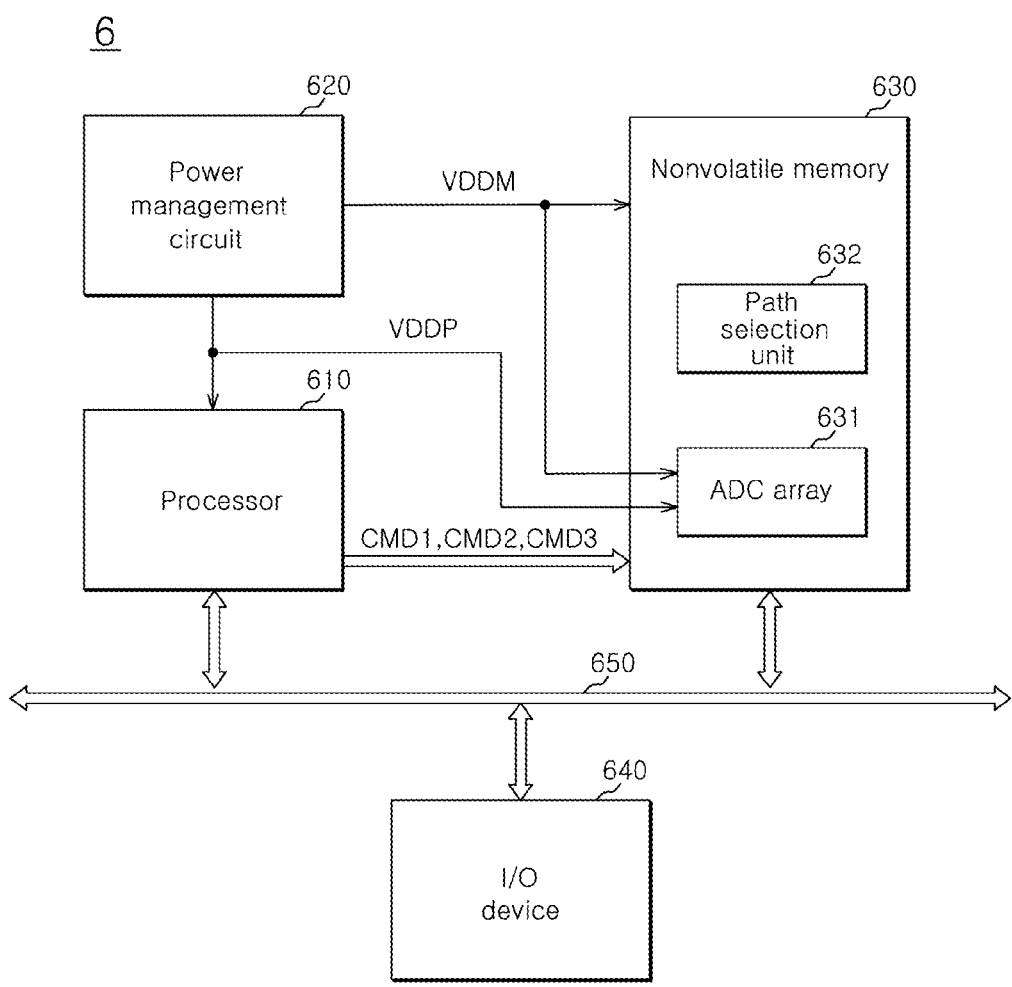
FIG. 8 is a block diagram schematically showing the configuration of a computer device in accordance with other embodiments of the present disclosure.

FIG. 8 is a block diagram schematically showing the configuration of a computer device 6 in accordance with an embodiment of the present disclosure. In FIG. 8, the computer device 6 may include a processor 610, a power management circuit 620, a nonvolatile memory 630, and an I/O device 640. The processor 610 may be configured to communicate with the nonvolatile memory 630 through a bus 650 and provide a command, data and a clock to the nonvolatile memory 630. The nonvolatile memory 630 may output data to the processor 610 through the bus 650. The I/O device 640 may be configured to input and output specified signals to allow the computer device 6 to communicate with an external device.

The power management circuit 620 may be configured to provide power to the processor 610 and the nonvolatile memory 630. The power management circuit 620 may provide a first power supply voltage VDDP as power for the processor 610, to the processor 610, and may provide a second power supply voltage VDDM as power for the nonvolatile memory 630, to the nonvolatile memory 630.

The processor 610 may provide a plurality of commands to the nonvolatile memory 630. For example, the plurality of commands may include first to third commands CMD1, CMD2 and CMD3. The first command CMD1 may command the nonvolatile memory 630 to perform a normal operation, and the second and third commands CMD2 and CMD3 may command the nonvolatile memory 630 to monitor the noise of the first and second power supply voltages VDDP and VDDM.

The nonvolatile memory 630 includes an ADC array 631, and a path selection unit 632. The ADC array 631 may be configured to read the data stored in the memory cells of the nonvolatile memory 630 in response to the first command CMD1. The path selection unit 632 may be configured to electrically couple the ADC array 631 with the terminal of the first power supply voltage VDDP in response to the second command CMD2. Accordingly, the path selection unit 632 allows the ADC array 631 to monitor the noise of the first power supply voltage VDDP as power for the processor 610. Also, the path selection unit 632 may be configured to electrically couple the ADC array 631 with the terminal of the second power supply voltage VDDM in response to the third command CMD3. Therefore, the path selection unit 632 allows the ADC array 631 to monitor the noise of the second power supply voltage VDDM as power for the nonvolatile memory 630. The nonvolatile memory 630 may monitor the noise of not only the power supply voltages VDDP and VDDM for the processor 610 and the nonvolatile memory 630 itself as shown in FIG. 8 but also a power supply voltage for other component elements which may be included in the computer device 6.

Figure 9:
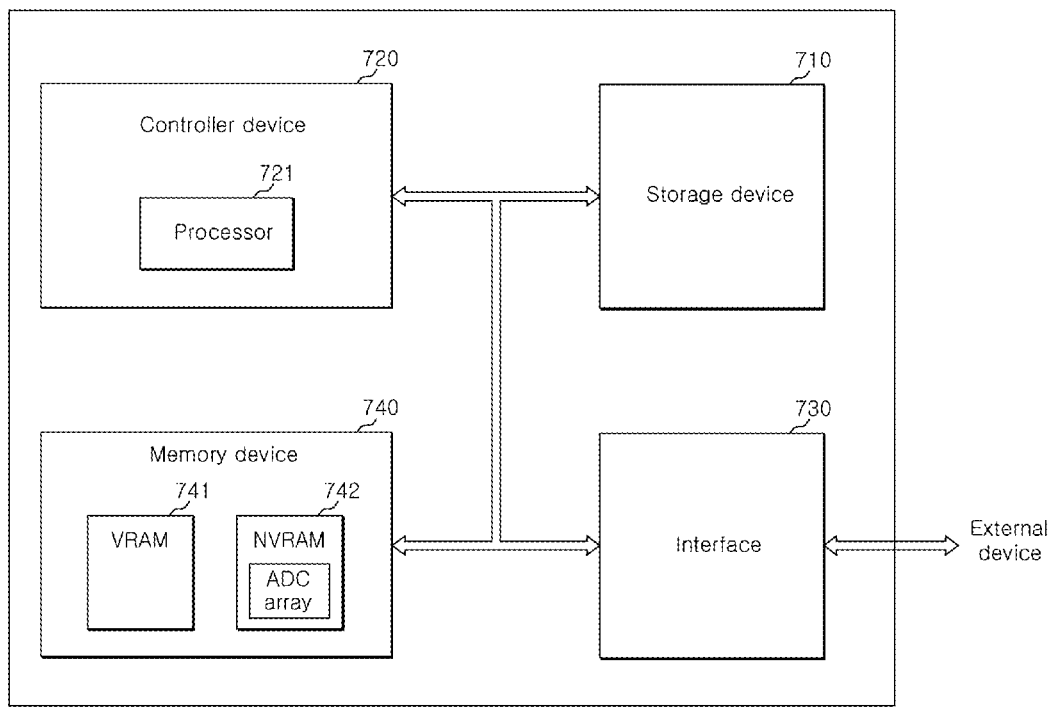
FIG. 9 is a block diagram schematically showing the configuration of a storage system in accordance with other embodiments of the present disclosure.

FIG. 9 is a block diagram schematically showing the configuration of a storage system 7 in accordance with an embodiment of the present disclosure. In FIG. 9, the storage system 7 may include a storage device 710 with a nonvolatile characteristic as a component element for data storage, a controller device 720 for controlling the storage device 710, and an interface 730 for electrical coupling to an outside. The storage device 710 may be a disk type such as a hard disk drive (HDD), a compact disc read only memory (CDROM), a digital versatile disc (DVD) and a solid state disk (SSD), and a card type such as a universal serial bus (USB) memory, a secure digital card (SD), a mini secure digital card (mSD), a micro secure digital card (micro SD), a secure digital high capacity card (SDHC), a memory stick card, a smart media card (SM), a multimedia card (MMC), an embedded MMC (eMMC) and a compact flash card (CF).

The controller device 720 may be configured to control exchange of data between the storage device 710 and the interface 730. To this end, the controller device 720 may include a processor 721 for operating and processing commands which are inputted through the interface 730 from an outside of the storage system 7 (i.e., External device).

The interface 730 is to exchange commands, data and the likes between the storage system 7 and an external device. In the case where the storage system 7 is a card type, the interface 730 may be an interface which is compatible with a universal serial bus (USB), a secure digital card (SD), a mini secure digital card (mSD), a micro secure digital card (micro SD), a secure digital high capacity card (SDHC), a memory stick card, a smart media card (SM), a multimedia card (MMC), an embedded MMC (eMMC) and a compact flash card (CF). In the case where the storage system 7 is a disk type, the interface 730 may be an interface which is compatible with IDE (Integrated Device Electronics), SATA (Serial Advanced Technology Attachment), SCSI (Small Computer System Interface), eSATA (external SATA), PCMCIA (Personal Computer Memory Card International Association) and USB (Universal Serial Bus).

The storage system 7 may include the interface 730 with an external device, the controller device 720, and a memory device 740 for efficient data transfer between the interface 730 and the storage device 710 according to the diversification and high performance of a system. The storage device 710 and the memory device 740 for temporarily storing data may include the nonvolatile memory apparatuses 2 and 4 in accordance with the aforementioned embodiments. In particular, the memory device 740 may be a hybrid type memory device including both a volatile memory (VRAM) 741 and a nonvolatile memory (NVRAM) 742. The volatile memory 741 may be used in processing of data which requires a high processing speed, and the nonvolatile memory 742 may be used in processing important data which should not be lost in a situation where a sudden power-off occurs and large capacity data. The nonvolatile memory 742 of the memory device 740 may include an ADC array such that the noise of a power supply voltage provided to the respective devices constituting the storage system 7 may be monitored.

Figure 10:
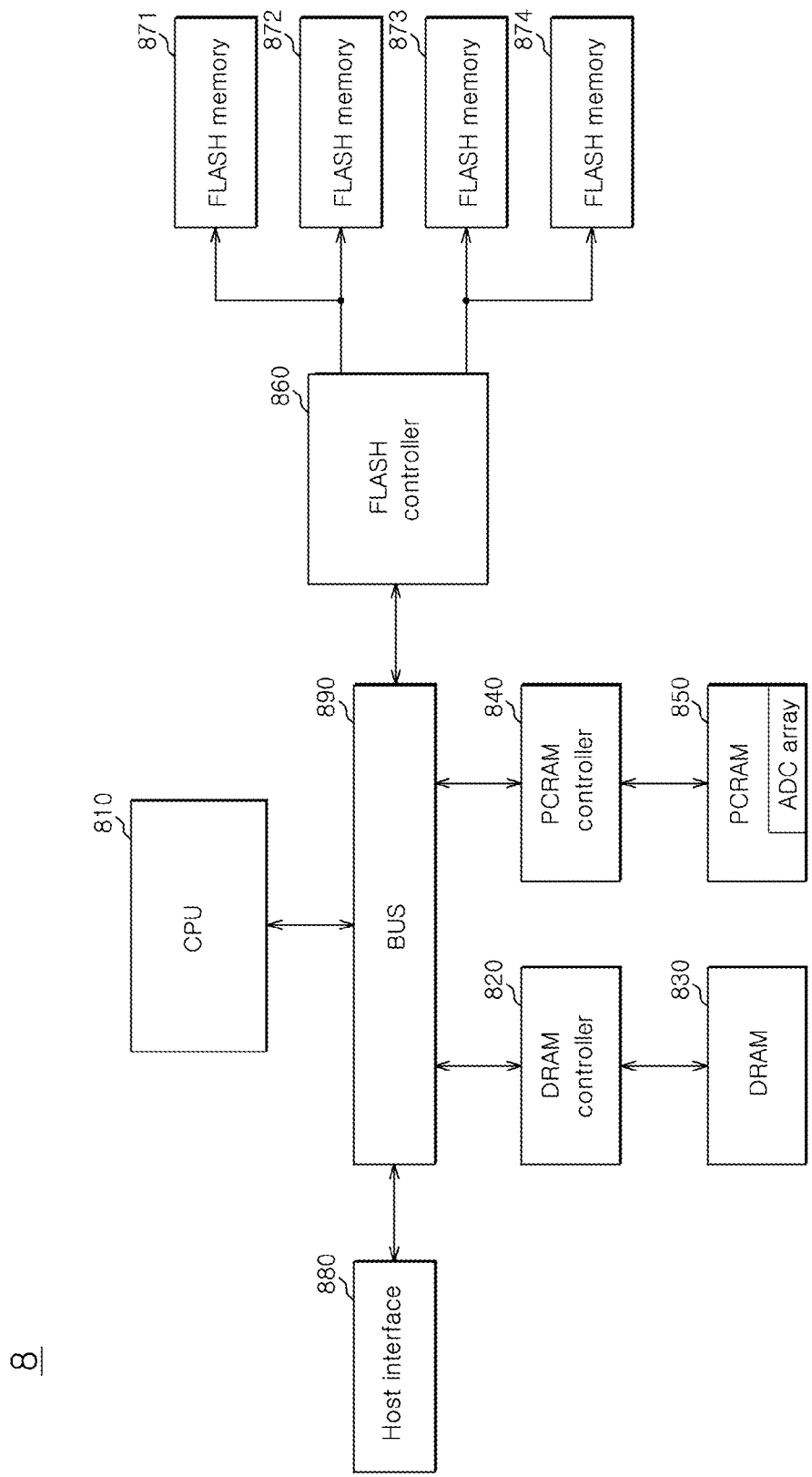
FIG. 10 is a block diagram schematically showing the configuration of a solid state storage system in accordance with other embodiments of the present disclosure.

FIG. 10 is a block diagram schematically showing the configuration of a solid state storage system 8 in accordance with an embodiment of the present disclosure. In FIG. 10, the solid state storage system 8 may include a processor 810 (i.e., Central Processing Unit CPU), a DRAM controller 820, a DRAM 830, a PCRAM controller 840, a PCRAM 850, a flash controller 860, and a plurality of flash memories 871 to 874. The processor 810 receives a command through a host interface 880 from a host and performs an operation. The DRAM controller 820 and the DRAM 830 may perform the function of a buffer so that communication, for example, between the host and the processor 810 may be smoothly implemented. The PCRAM controller 840 and the PCRAM 850 may perform the function of a buffer so that communication, for example, between the processor 810 and the flash controller 860 may be smoothly implemented.

The flash controller 860 may control the plurality of flash memories 871 to 874, and may store the data inputted through a bus 890, in the flash memories 871 to 874 or output the data outputted from the flash memories 871 to 874, to the bus 890.

In FIG. 10, the DRAM 830 and the PCRAM 850 perform the functions of buffer memories and constitute a hybrid type memory device. The PCRAM 850 may include an ADC array such that the noise of a power supply voltage provided to the respective devices constituting the solid state storage system 8 may be monitored.

While various embodiments have been described above, it will be understood to those skilled in the art that the embodiments described are by way of example only. Accordingly, the nonvolatile memory apparatus and the semiconductor system using the same described herein should not be limited based on the described embodiments. Rather, the nonvolatile memory apparatus and the semiconductor system using the same described herein should only be limited in light of the claims that follow when taken in conjunction with the above description and accompanying drawings.

What is claimed is:

1. A nonvolatile memory apparatus comprising:
   a memory cell array including a plurality of sub arrays;
   a plurality of analog-to-digital converters (ADCs) configured to sense sensing voltages outputted from memory cells of the plurality of sub arrays; and
   a path selection unit configured to electrically couple the plurality of sub arrays with the plurality of ADCs in one-to-one correspondence in a first operation mode, and electrically couple the plurality of ADCs with a terminal of a power supply voltage in a second operation mode,
   wherein the plurality of ADCs monitor a noise of the power supply voltage when the plurality of ADCs are electrically coupled with the terminal of the power supply voltage.

2. The nonvolatile memory apparatus according to claim 1, wherein the path selection unit electrically couples one of the plurality of sub arrays and the terminal of the power supply voltage with the plurality of ADCs in response to an operation mode setting signal.

3. The semiconductor system according to claim 2, wherein the plurality of ADCs are electrically coupled in parallel with the terminal of the power supply voltage in response to the operation mode setting signal.

4. The nonvolatile memory apparatus according to claim 1, further comprising:
   a data output unit configured to combine outputs of the plurality of ADCs and generate output data.

5. The nonvolatile memory apparatus according to claim 1, wherein the first operation mode corresponds to a read command to read data stored in the memory cell array.

6. The nonvolatile memory apparatus according to claim 1, wherein the first operation mode is different from the second operation mode.

7. A nonvolatile memory apparatus comprising:
   a first analog-to-digital converter (ADC) array configured to sense sensing voltages outputted from memory cells of a first memory bank;
   a second ADC array configured to sense sensing voltages outputted from memory cells of a second memory bank;
   a first path selection unit configured to electrically couple the first ADC array with a terminal of a power supply voltage when a normal operation is not performed for the first memory bank; and
   a second path selection unit configured to electrically couple the second ADC array with the terminal of the power supply voltage when a normal operation is not performed for the second memory bank,
   wherein the first and second ADC arrays monitor a noise of the power supply voltage when the first and second ADC arrays are electrically coupled with the terminal of the power supply voltage.

8. The nonvolatile memory apparatus according to claim 7, wherein the first path selection unit electrically couples the memory cells of the first memory bank or the terminal of the power supply voltage with the first ADC array in response to a first operation mode setting signal.

9. The nonvolatile memory apparatus according to claim 8, wherein the first operation mode setting signal includes bank selecting information for the first memory bank and information on the normal operation.

10. The nonvolatile memory apparatus according to claim 7, wherein the second path selection unit electrically couples the memory cells of the second memory bank or the terminal of the power supply voltage with the second ADC array in response to a second operation mode setting signal.

11. The nonvolatile memory apparatus according to claim 10, wherein the second operation mode setting signal includes bank selecting information for the second memory bank and information on the normal operation.

12. The nonvolatile memory apparatus according to claim 8, further comprising:
 a first data output unit configured to combine outputs of the first ADC array and generate first output data; and
 a second data output unit configured to combine outputs of the second ADC array and generate second output data.

13. A semiconductor system comprising:
 a processor; and
 a nonvolatile memory configured to operate by receiving a power supply voltage and a plurality of commands from the processor,
 wherein the nonvolatile memory comprises:
 an analog-to-digital converter (ADC) array configured to read data stored in a memory cell array; and
 a path selection unit configured to electrically couple the ADC array with a terminal of the power supply voltage in response to one of the plurality of commands,
 wherein the ADC array monitors a noise of the power supply voltage when the ADC array is electrically coupled with the terminal of the power supply voltage.

14. The semiconductor system according to claim 13, wherein the ADC array is electrically coupled in parallel with the terminal of the power supply voltage in response to the command.

15. A semiconductor system comprising:
 a processor; and
 a nonvolatile memory configured to operate by receiving a power supply voltage,
 wherein the nonvolatile memory comprises:
 an analog-to-digital converter (ADC) array configured to read data stored in a memory cell array in a first operation mode;
 a path selection unit configured to electrically couple the ADC array with a terminal of the power supply voltage in a second operation mode; and
 a decoupling capacitor array configured to control a level of the power supply voltage in response to an output of the ADC array in the second operation mode.

16. The semiconductor system according to claim 15, wherein the path selection unit electrically couples in parallel the ADC array with the terminal of the power supply voltage in response to a command signal.

17. The semiconductor system according to claim 15, wherein the decoupling capacitor array includes a plurality of decoupling capacitors which are electrically coupled with the terminal of the power supply voltage, and controls the number of decoupling capacitors which are electrically coupled with the terminal of the power supply voltage, in response to the output of the ADC array.

18. A semiconductor system comprising:
 a processor configured to generate a clock and provide the clock to a nonvolatile memory; and
 the nonvolatile memory configured to operate by receiving a power supply voltage and the clock,
 wherein the nonvolatile memory comprises:
 an analog-to-digital converter (ADC) array configured to read data stored in a memory cell array in a first operation mode; and
 a path selection unit configured to electrically couple the ADC array with a terminal of the power supply voltage in a second operation mode, and
 wherein the processor changes a frequency of the clock on the basis of an output of the ADC array in the second operation mode.

19. The semiconductor system according to claim 18, wherein the path selection unit electrically couples in parallel the ADC array with the terminal of the power supply voltage in response to a command signal.

20. The semiconductor system according to claim 18, wherein the processor comprises a clock frequency control unit configured to receive the output of the ADC array and control the frequency of the clock to be provided to the nonvolatile memory.

21. A computer device comprising:
 a processor;
 a nonvolatile memory configured to communicate with the processor; and
 a power management circuit configured to provide a first power supply voltage to the processor and provide a second power supply voltage to the nonvolatile memory,
 wherein the nonvolatile memory comprises:
 an analog-to-digital converter (ADC) array configured to read data stored in a memory cell array in response to a first command; and
 a path selection unit configured to electrically couple the ADC array with a terminal of the first power supply voltage in response to a second command, and electrically couple the ADC array with a terminal of the second power supply voltage in response to a third command,
 wherein the ADC array monitors a noise of the first power supply voltage when the ADC array is electrically coupled with the terminal of the first power supply voltage and the ADC array monitors a noise of the second power supply voltage when the ADC array is electrically coupled with the terminal of the second power supply voltage.

22. The computer device according to claim 21, wherein the path selection unit electrically couples in parallel the ADC array with the terminal of the first power supply voltage in response to the second command, and electrically couples in parallel the ADC array with the terminal of the second power supply voltage in response to the third command.

23. A nonvolatile memory apparatus comprising:
 a memory cell array including a plurality of sub arrays;
 a plurality of analog-to-digital converters (ADCs) configured to sense sensing voltages outputted from memory cells of the plurality of sub arrays; and
 a path selection unit configured to electrically couple the plurality of sub arrays with the plurality of ADCs in a first operation mode, and electrically couple the plurality of ADCs with a terminal of a power supply voltage in a second operation mode,
 wherein the plurality of ADCs monitor a noise of the power supply voltage when the plurality of ADCs are electrically coupled with the terminal of the power supply voltage.

24. The nonvolatile memory apparatus according to claim 23, wherein the number of ADCs is equal to or greater than the number of sub arrays.

25. The nonvolatile memory apparatus according to claim 23, wherein the plurality of sub arrays is coupled with the plurality of ADCs in one-to-one correspondence in a first operation mode.

* * * * *